US012784826B2

(12) United States Patent
Hirtzlin et al.

(10) Patent No.: US 12,784,826 B2
(45) Date of Patent: Nov. 3, 2026

(54) METHOD FOR CALCULATING A MAC OPERATION IN A 1S1R-TYPE RRAM MEMORY

(71) Applicant: COMMISSARIAT À L'ENERGIE ATOMIQUE ET AUX ÉNERGIES ALTERNATIVES, Paris (FR)

(72) Inventors: Tifenn Hirtzlin, Grenoble (FR); Elisa Vianello, Grenoble (FR); Gabriel Molas, Grenoble (FR); Joël Minguet Lopez, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 446 days.

(21) Appl. No.: 18/321,399

(22) Filed: May 22, 2023

(65) Prior Publication Data

US 2023/0377647 A1 Nov. 23, 2023

(30) Foreign Application Priority Data

May 23, 2022 (FR) ........................................ 2204938

(51) Int. Cl.
*G11C 13/00* (2006.01)
*G11C 11/54* (2006.01)

(52) U.S. Cl.
CPC ............ *G11C 13/004* (2013.01); *G11C 11/54* (2013.01); *G11C 13/0026* (2013.01); *G11C 13/0028* (2013.01)

(58) Field of Classification Search
CPC .............. G11C 13/004; G11C 13/0026; G11C 13/0028; G11C 11/54
See application file for complete search history.

(56) References Cited

U.S. PATENT DOCUMENTS 10,860,682 B2 * 12/2020 Knag ...................... G11C 11/56
10,943,652 B2 * 3/2021 Lu ...................... G11C 13/0028
(Continued)

OTHER PUBLICATIONS

Li, Huihan, et al. "Memrisitive Crossbar Arrays for Storage and Computing Applications" Advance Intelligent Systems, 2021, vol. 3, No. 2100017, pp. 1-26.
(Continued)

*Primary Examiner* — Amir Zarabian
(74) *Attorney, Agent, or Firm* — McDonald Hopkins LLC

(57) ABSTRACT

A method for calculating a MAC operation is performed by a memory, in particular in the neuromorphic calculation field. It allows performing the scalar product between an activation vector whose elements are binary with a vector of synaptic coefficients, quantised over M>2 levels. The calculation comprises a first phase, in which M−1 reading voltages $V_{read_2}, \ldots, V_{read_{M-1}}$ are applied to the word lines corresponding to a positive activation and the number of passing cells in a bit line is determined for each of these voltages. In a second phase, these M−1 reading voltages are applied to the word lines corresponding to a negative activation and, for each of them, the number of passing cells in the bit line is determined again. The scalar product is then deduced from the difference between the total number of passing cells in the first phase and the total number of passing cells in the second phase.

9 Claims, 9 Drawing Sheets

(56) References Cited

U.S. PATENT DOCUMENTS

| | | | | |
|---|---|---|---|---|
| 2019/0362787 | A1 | 11/2019 | Lu et al. | |
| 2023/0206964 | A1* | 6/2023 | Shen | G11C 13/0004<br>365/163 |
| 2024/0069780 | A1* | 2/2024 | Yin | G06F 3/065 |

OTHER PUBLICATIONS

Esmanhotto, E. et al. "High-density 3D monolithically integrated multiple 1T1R multiple-level cell for neural networks" Conference Paper—Dec. 2020.

Jung, Je-Min et al. "Challenges and Trends of Nonvolatile In-Memory Computation Circuits for AI Edge Devices" IEEE Open Journal of Solid-State Circuits Society, 2021, pp. 1-14.

Truong, Son Ngoc, "Single crossbar array of memristors with bipolar inputs for neuromorphic image recognition" IEEE Acces, 2017, pp. 1-9.

Hung, Je-Min et al. "Challenges and Trends in Developing Non-volatile Memory-Enabled Computing Chips for Intelligent Edge Devices" IEEE Transactions on Electron Devices, Apr. 4, 2020, vol. 67, No. 4, pp. 1444-1453.

* cited by examiner

| a | G/w | $I_{out}$ | digital output |
| --- | --- | --- | --- |
| -1 | $G_{off}$/-1 | $I_{leak}$ | NA |
| -1 | $G_{on}$/+1 | $I_{leak}$ | NA |
| +1 | $G_{off}$/-1 | $I_{HRS}$ | -1 |
| +1 | $G_{on}$/+1 | $I_{LRS}$ | +1 |

FIG. 3C

| a | G/w | $I_{out}$ | digital output |
| --- | --- | --- | --- |
| -1 | $G_{off}$/-1 | $I_{HRS}$ | +1 |
| -1 | $G_{on}$/+1 | $I_{LRS}$ | -1 |
| +1 | $G_{off}$/-1 | $I_{leak}$ | NA |
| +1 | $G_{on}$/+1 | $I_{leak}$ | NA |

FIG. 3D

| a | G/w | $I_{out}$ | digital output |
|---|---|---|---|
| -1 | $G_{off,off}$/-1 | $I_{leak}$ | NA |
| -1 | $G_{off,on}$/0 | $I_{leak}$ | NA |
| -1 | $G_{on,on}$/+1 | $I_{leak}$ | NA |
| +1 | $G_{off,off}$/-1 | $I_{HRS}$, $I_{HRS}$ | 0 |
| +1 | $G_{on,off}$/+1 | $I_{HRS}$, $I_{LRS}$ | 1 |
| +1 | $G_{on,on}$/+1 | $I_{LRS}$, $I_{LRS}$ | 2 |

| a | G/w | $I_{out}$ | digital output |
|---|---|---|---|
| -1 | $G_{off,off}$/-1 | $I_{HRS}$, $I_{HRS}$ | 0 |
| -1 | $G_{on,off}$/+1 | $I_{HRS}$, $I_{LRS}$ | 1 |
| -1 | $G_{on,on}$/+1 | $I_{LRS}$, $I_{LRS}$ | 2 |
| +1 | $G_{off,off}$/-1 | $I_{leak}$ | NA |
| +1 | $G_{off,on}$/0 | $I_{leak}$ | NA |
| +1 | $G_{on,on}$/+1 | $I_{leak}$ | NA |

FIG. 4D

METHOD FOR CALCULATING A MAC OPERATION IN A 1SIR-TYPE RRAM MEMORY

CROSS-REFERENCE TO RELATED APPLICATIONS

This application claims priority from French Patent Application No. 2204938 filed on May 23, 2022. The content of this application is incorporated herein by reference in its entirety.

TECHNICAL FIELD

The present invention generally relates to the field of resistive random access memories or RRAM, and more particularly the so-called 1S1R-type ones, whose memory cells comprise a selector and a programmable resistance. In particular, it finds application in hardware accelerators for deep learning, more particularly in the implementation of MAC (Multiply ACcumulate) operations.

PRIOR ART

Artificial neural networks are used in quite many artificial intelligence applications. In general, the calculations required by these neural networks are performed by software executed by a processor, the intermediate results being stored in a memory. The processing by the processor and the considerable data exchanges between the processor and the memory lead to a high energy consumption in particular for large-sized networks. Yet, the energy resources are sometimes very limited such as within the nodes of connected networks. This results in that the calculations have to be made in the Cloud or at the network periphery.

However, the use of artificial neural networks in connected objects is sometimes desirable for reasons related to security, offline availability or lag time.

Recently, resistive memories or RRAM have been suggested as hardware accelerators with a low energy consumption to perform some neuromorphic calculations, like the MAC (Multiply ACcumulate) operations taking place in the products between matrices of synaptic weights and activation vectors.

A description of the use of resistive memories for neuromorphic calculations could be found in the article by H. Li et al. entitled "Memristive crossbar arrays for storage and computing applications" published in Adv. Intell. Syst., 3, 2100017, pp. 1-26.

The resistive memories are composed of cells each comprising a resistive element with a variable resistance encoding a synaptic coefficient. In its simplest form, a resistive memory implements a binary neural network or BNN. Each resistive element of one cell is made of a material capable of toggling in a reversible manner between a high-resistance state or HRS and a low-resistance state or LRS. Different technologies allow carrying out such a toggling between two resistivity states. Thus, one could distinguish the phase-change memories or PCRAM (Phase Change Random Access Memory), the so-called conductive-bridge memories or CBRAM (Conductive Bridge Random Access Memory), the ferroelectric memories or FERAM (FErroelectric Random Access Memory), the oxide-based memories or OxRAM (Oxide based Random Access Memory). In these memories, each cell can store only one data bit, represented by the state of the resistive element.

A method for performing a neuromorphic calculation, more specifically the product of a matrix of synaptic coefficients of a BNN network with a vector whose elements are the activation values of the neurons of a layer has been described in the article by S. N. Truong entitled "Single crossbar array of memristors with bipolar inputs for neuromorphic image recognition" published in IEEE Access, vol. 8, pp. 69327-69332.

If we denote $\boldsymbol{a}^{\ell}$ the activation vector of the layer $\ell$, $\boldsymbol{a}^{\ell+1}$ the activation vector of the layer $\ell+1$, and $\boldsymbol{W}^{\ell,\ell+1}$ the matrix of the synaptic coefficients between the two layers, we have:

$$\boldsymbol{a}^{\ell+1} = \text{sign}(\boldsymbol{W}^{\ell,\ell+1}\boldsymbol{a}^{\ell}) \quad (1)$$

where sign(a) is the operation which gives the sign of the different elements of the vector a. The activation value of the neuron i of the layer $\ell+1$ is thus obtained from the sign of the scalar product:

$$a_i^{\ell+1} = \text{sign}\left(w_i^{\ell,\ell+1} a^{\ell}\right) = \text{sign}\left(\sum_j W_{ij}^{\ell,\ell+1} a_j^{\ell}\right) \quad (2)$$

Where $$w_i^{\ell,\ell+1}$$

is the line vector corresponding to the ith line of the matrix $\boldsymbol{W}^{\ell,\ell+1}$. The scalar product involved in the expression (2) simply measure the similarity between the vector $$w_i^{\ell,\ell+1}$$

stored in the RRAM and the input vector $\boldsymbol{a}^{\ell}$ $$w_i^{\ell,\ell+1} \cdot a^{\ell} = popcount(\overline{w_i^{\ell,\ell+1} \oplus a^{\ell}}) = popcount\left(XNOR\left(w_i^{\ell,\ell+1}, a^{\ell}\right)\right) \quad (3)$$

where the XNOR operation should be understood on each of the bits of the two vectors and popcount is the sum (positive or negative) of the bits of the resulting vector.

The aforementioned article suggests calculating the scalar product $$w_i^{\ell,\ell+1} a^{\ell}$$

by applying at the input of the RRAM memory the binary word $\boldsymbol{a}^{\ell}$ in polar representation ($\tilde{\boldsymbol{a}}^{\ell} = \boldsymbol{a}^{\ell} - \bar{\boldsymbol{a}}^{\ell}$) and by performing a current reading on the corresponding output line i, the sum $$\sum_j W_{ij}^{\ell,\ell+1} a_j^{\ell}$$

simply resulting from Kirchhoff law.

Memory technologies, some of which can be used for MAC address computation, are disclosed in patent document US 2019/362787 and in J-M. Hung, X. Li, J. Wu, and M-F. Chang, "Challenges and Trends in Developing Nonvolatile Memory-Enabled Computing Chips for Intelligent Edge Devices," IEEE Transactions on Electron Devices, vol. 67, no. 4, pp. 1444-1453, April 2020, doi: 10.1109/TED.2020.2976115.

Recently, resistive memories allowing storing several bits per cell have been developed. The article by E. Esmanhotto et al. entitled "High-density monolithically integrated multiple 1T1R multiple-level cell for neural networks" published in IEEE International Electron Devices Meeting (IEDM) Proc. December 2020, pp. 36.5.1-36.5.4 describes in particular a multi-level resistive cell or MLC (Multi-Level Cell) of the 1T1R type i.e. consisting of a resistive element and a transistor allowing blocking or giving access to the resistive element for reading or writing operations while limiting the leakage currents in the rest of the array.

Nonetheless, the 1T1R cells do not allow reaching a high level of integration because of the surface necessary to make the access transistor. For this reason, it is preferred to use 1S1R-type cells comprising a non-linear selector and a resistive element in series, the selector generally being an ovonic threshold switch or OTS (Ovonic Threshold Selector).

A 1S1R-type resistive memory is represented in FIG. 1. The latter consists of an array, 100, of input lines, 111, 112, 113, 114 and of output lines, 121, 122, 123, 124 according to a cross-bar type arrangement. Each memory cell 130 is composed of a non-linear selector 131 and of a memory element 132 mounted in series between an input line (or word line) and an output line (or bit line).

FIG. 2 schematically illustrates the voltage-current characteristics during an operation of reading a multi-level 1S1R-type memory cell, herein with 3 programming levels. The three programming levels respectively correspond to characteristics Iprog1, Iprog2, Iprog3, substantially offset in voltage with respect to each other. It is possible that a current reading of the cell (i.e. by injecting a reading current in the latter) does not allow determining the state of the cell if the reading current is higher than a maximum value I_LRS, or if the reading current is lower than a minimum value I_HRS. Neither does the application of a voltage at the input and the reading of the corresponding output current allows discriminating the different states of the cell. Thus, for example, a reading at the voltage Vread1, does not allow distinguishing the second and third states and a reading at the voltage Vread2 does not allow distinguishing the first and second states.

Consequently, it is difficult to read the value of a synaptic coefficient stored in an MLC RRAM memory cell and a fortiori carry out a neuromorphic calculation such as a MAC operation by means of such an MLC RRAM memory.

Consequently, an object of the present invention is to provide a method for performing a neuromorphic calculation and in particular a MAC operation by means of an MLC RRAM memory.

DISCLOSURE OF THE INVENTION

The present invention is defined by a method for calculating a MAC operation to provide the scalar vector between a first vector, whose elements are binary elements, and a second vector whose elements are values quantised over M>2 levels, said operation being carried out by means of a memory composed of memory cells including a plurality of word lines and a plurality of bit lines, a memory cell relating each word line to each bit line according to a crossbar configuration, each memory cell possibly taking on a plurality M of states, each state being associated with a current-voltage characteristic of the cell, the memory cells of a bit line storing the elements of the second vector, wherein each memory cell is read by successively applying M−1 voltages $V_{read_1}, V_{read_2}, \ldots, V_{read_{M-1}}$ on its word line and by reading the corresponding output currents on its bit line, said output currents giving a representation in the form of a thermometric code of the stored element, said method comprising:

a first reading phase in which the word lines corresponding to the elements of the first vector having a first binary value are selected, the voltages $V_{read_1}, V_{read_2}, \ldots, V_{read_{M-1}}$ are successively applied to the word lines thus selected, the corresponding output currents are read on the bit line and the number of passing cells on this bit line is deduced at each reading;

a second reading phase in which the word lines corresponding to the elements of the first vector having a second binary value are selected, the voltages $V_{read_1}, V_{read_2}, \ldots, V_{read_{M-1}}$ are successively applied to the word lines thus selected, the corresponding output currents are read on the bit line and the number of passing cells on this bit line is deduced at each reading;

the difference between the total number of passing cells in the first phase and the total number of passing cells in the second phase is calculated;

the difference thus obtained is corrected for a bias equal to the difference between the number of elements of the first vector having the first binary value and the number of elements of the second vector having the second binary value, to thereby deduce said scalar product between the first vector and the second vector.

Advantageously, the memory cells are made by means of an ovonic selector in series with a resistive element programmable in a low-resistivity state (LRS) or a high-resistivity element (HRS).

The first vector may be an activation vector whose elements are the activation values of a neural layer, the activation values possibly taking on the values +1 and −1.

The second vector may be a synaptic coefficient vector of synapses between said neural layer and the next layer of a neural network quantised over M levels.

The M possible quantised values of the synaptic coefficients are typically equal to $$-1, -1+\frac{2}{M-1}, \ldots, 1-\frac{2}{M-1}, +1.$$

In this case, the scalar product may be deduced from the difference between the total number of passing cells in the first phase and the total number of passing cells in the second phase, corrected for the bias, by means of a normalisation operation transforming an integer X into a synaptic coefficient quantised value, $$-1+\frac{2}{M-1}X.$$

The memory can be a RRAM memory of 1S1R type or a memory with three terminals.

BRIEF DESCRIPTION OF THE DRAWINGS

Other features and advantages of the invention will appear upon reading a preferred embodiment of the invention, made with reference to the appended figures wherein:

FIGS. 3C and 3D represent two truth tables allowing carrying out a XNOR operation in a 1S1R-type RRAM memory in a sequential manner;

FIG. 4B schematically represents the voltage-current characteristic of a multi-level 1S1R resistive memory cell used in FIG. 4A;

FIGS. 4C and 4D schematically represent two truth tables allowing carrying out a product operation in a multi-level 1S1R-type RRAM memory in a sequential manner;

DETAILED DISCLOSURE OF PARTICULAR EMBODIMENTS

Next, as a non-limiting example, we will consider an MLC RRAM memory i.e. whose memory cells are capable of storing a piece of information over M>2 levels (or states), in other words a piece of information of more than one bit. Furthermore, we will suppose that this memory is a 1S1R-type crossbar array, i.e. each of the memory cells of which comprises a selector and a programmable resistive element.

Other types of memory can be used to implement the present invention, such as a three-terminal memory, such as FeFET memories or flash memories.

Furthermore, in general, the present invention can be implemented with different types of selector element. Typically, the selector element is an ovonic threshold selector or OTS. Nonetheless, a person skilled in the art should understand that any selector capable of triggering at one or more threshold value(s) could be used by a person skilled in the art without departing from the scope of the present invention. For example, the selector can also be a Mixed Ionic Electronic conduction ('MIEC') selector, a Metal Insulator Transition ('MIT') selector, a diode type selector or a filamentary volatile selector.

Nonetheless, for simplicity, we will consider beforehand a 1S1R memory cell with only M=2 levels. In such a case, the cell may be programmed in a high resistivity state (HRS) and therefore with a low conductance, denoted $G_{off}$, or in a low resistivity state (LRS) and therefore with a high conductance, denoted $G_{on}$.

One idea at the origin of the present invention is to sequentially apply a first voltage and a second reading voltage, and to deduce corresponding currents, read at the output, the result of the operation a·w where a is a polar binary activation value (a=±1) and W is the value of the binary synaptic weight stored in the cell (w=±1). The value w=−1 is stored by programming the cell with the conductance $G_{off}$ and the value w=+1 is stored with the conductance $G_{on}$. The first reading voltage is selected equal to zero if the activation value is equal to −1 and equal to $V_{read}$ with $V_{TH\text{-}LRS}<V_{read}<V_{TH\text{-}HRS}$ where $[V_{TH\text{-}LRS}, V_{TH\text{-}HRS}]$ is a voltage range in which the conductance takes on the value $G_{off}$ if w=−1 and the value $G_{on}$ if w=±1.

Figure 1:
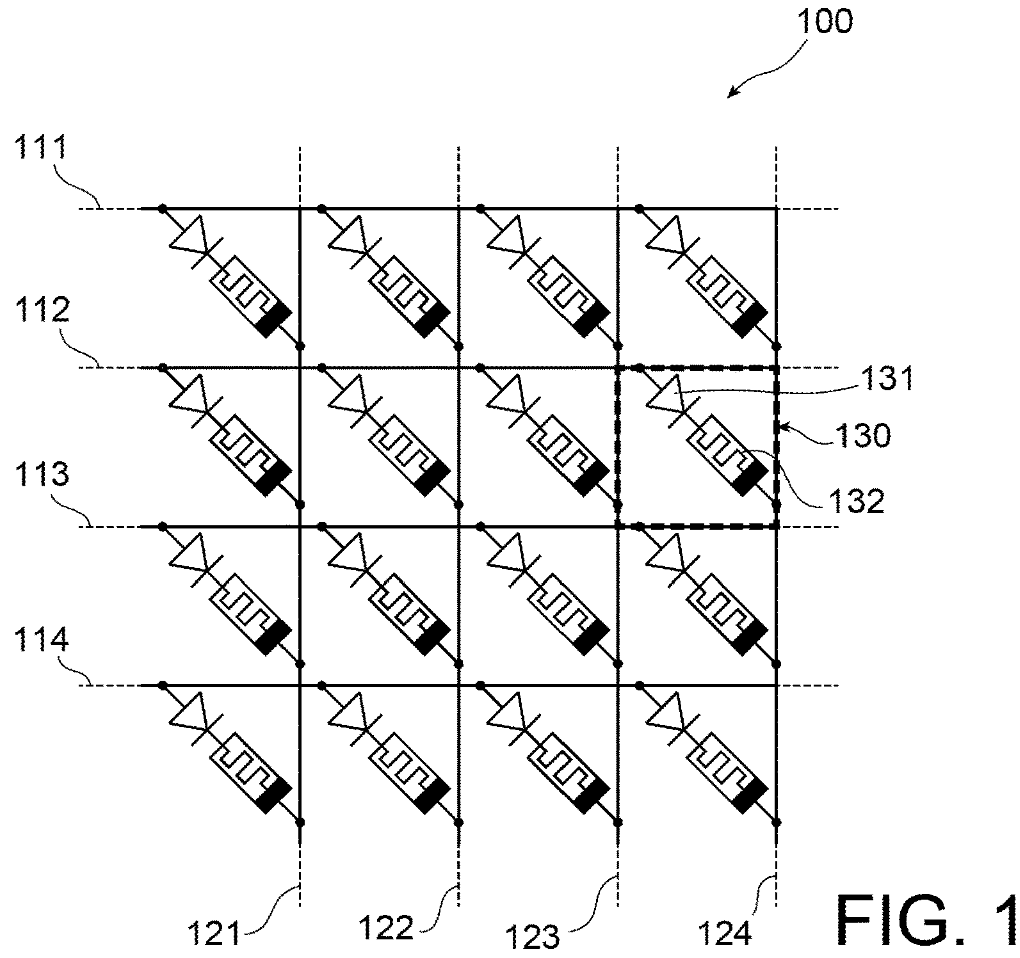
FIG. 1, already described, schematically represents a 1S1R-type resistive memory.
Figure 2:
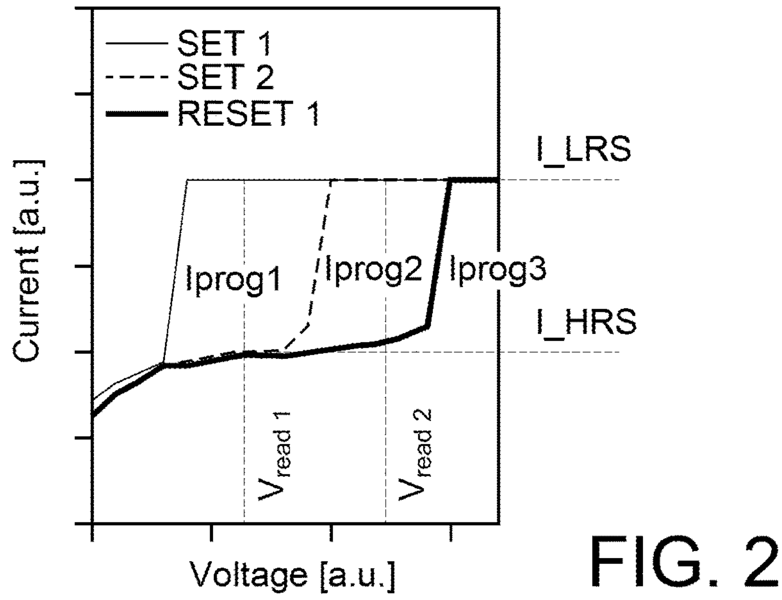
FIG. 2, already described, schematically represents the voltage-current characteristics of a multi-level 1S1R resistive memory cell according to the level programmed in the cell.
Figure 3A:
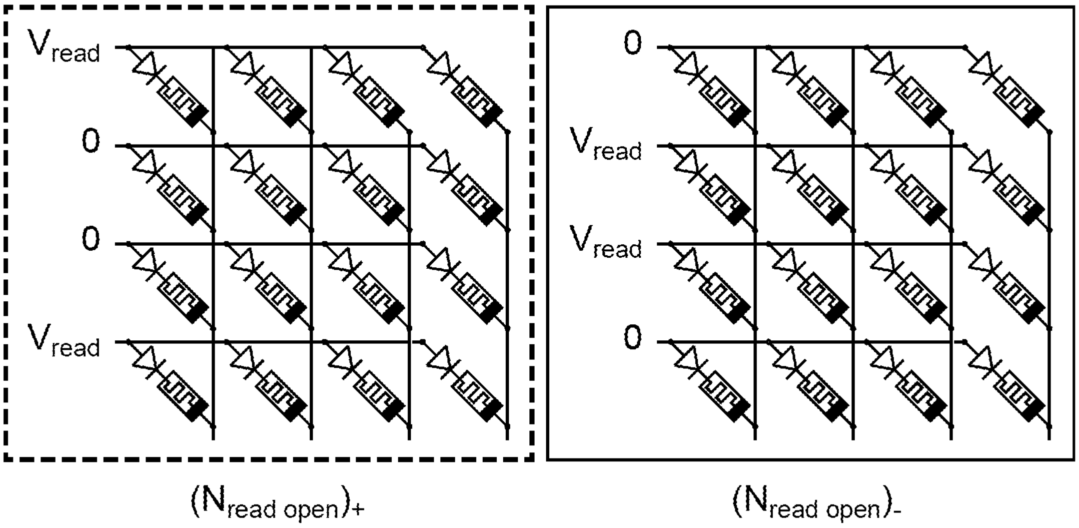
FIG. 3A schematically represents two successive reading phases of a 1S1R RRAM memory illustrating the calculation principal of a MAC operation according to the present invention.

FIG. 3A schematically illustrates the two reading phases of a 1S1R memory allowing performing the calculation of a MAC operation. In this example, it is supposed that the activation vector was equal to $(+1, -1, -1, +1)^T$. In a first phase, the reading voltage $V_{read}$ is applied at the input of the memory to the word lines corresponding to the positive activation values and the output current for each bit line is read. The latter is equal to the sum of the currents in the different memory cells of the column. Similarly, in a second phase, the reading voltage $V_{read}$ is applied at the input of the memory to the word lines corresponding to the negative activation values and the output current for each bit line is read again.

The behaviour of such a memory cell during these two reading phases is now considered.

Figure 3B:
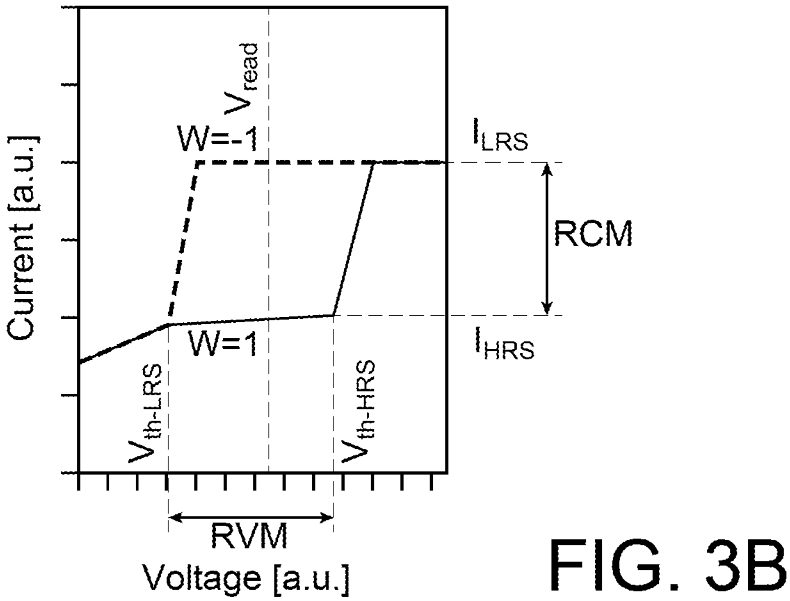
FIG. 3B schematically represents the voltage-current characteristic of a 1S1R resistive memory cell according to the bit stored in the cell.

The voltage-current characteristic of a two-level type memory cell is represented in FIG. 3B. One could see that the reading voltage $V_{read}$ has been selected such that $V_{TH\text{-}LRS}<V_{read}<V_{TH\text{-}HRS}$, herein substantially at the middle of the range $[V_{TH\text{-}LRS}, V_{TH\text{-}HRS}]$.

FIG. 3C schematically represents the truth table of a two-level memory cell during the first reading phase. Since only the lines corresponding to positive activation values are read, only the circled portion at the bottom of the table is relevant. When the cell is not read, i.e. when its input is grounded, only a leakage current (originating from the neighbouring read cells), $I_{leak}$, with a negligible value, crosses the considered cell. However, when the cell is read, the output current depends on its state. If its state is HRS (high resistivity, conductance $G_{off}$), corresponding to a stored synaptic coefficient equal to −1, the output current is equal to $I_{HRS}$ Conversely, if its state is LRS (low resistivity, conductance $G_{on}$), corresponding to a stored synaptic coefficient equal to +1, the output current is equal to $I_{LRS}$. In the first case, conventionally, −1 is assigned to a read current equal to $I_{HRS}$ and +1 to a read current equal to $I_{LRS}$.

FIG. 3D schematically represents the truth table of the same cell during the second reading phase. Since only the lines corresponding to negative activation values, only the circled portion at the top of the table is relevant. Herein again, when the cell is not read, only a leakage current, $I_{leak}$, crosses the considered cell. However, when the cell is read, the output current depends on its state. If its state is HRS (high resistivity, conductance $G_{off}$), corresponding to a stored synaptic coefficient equal to −1, the output current is equal to $I_{HRS}$ Conversely, if its state is LRS (low resistivity, conductance $G_{on}$), corresponding to a stored synaptic coefficient equal to +1, the output current is equal to $I_{LRS}$ In the first case, conventionally, +1 is assigned to a read current equal to $I_{HRS}$ and −1 to a read current equal to $I_{LRS}$ It should be pointed out that if the two circled portions of the truth table are grouped together, that of XNOR(w, a) is obtained, i.e. that of a comparison of the activation value with the value of the synaptic coefficient.

Returning now back to FIG. 3A and considering a given column, the current read during the first reading phase is in the range of $(N_{read\ open})_{+}I_{LRS}$ where $(N_{read\ open})_{+}$ is the number of passing cells in the column during the first reading phase. Similarly, the current read during the second reading phase is in the range of $(N_{read\ open})_{-}I_{LRS}$ where $(N_{read\ open})_{+}$ is the number of passing cells in the column during the second reading phase. The number of passing cells $(N_{read\ open})_{-}$ in the second phase is subtracted from the number of passing cells in the first phase, which is represented in the figure by the expression $(N_{read\ open})_{+}-(N_{read\ open})_{-}$.

If the number of positive activation values is equal to the number of negative activation values, the difference $(N_{read\ open})_{+}-(N_{read\ open})_{-}$ is none other than the scalar product w·a where the (binary) elements of the vector w are stored in the cells of the column. Nonetheless, in general, the obtained result should be corrected for a bias related to the difference between the number of positive activation values and that of negative activation values $$w\cdot a=(N_{read\ open})_{+}-(N_{read\ open})_{-}-\left(\sum a_i^{+}-\sum a_i^{-}\right) \tag{4}$$

The first (resp. second) term of the expression (4) corresponds to the number of passing cells of the bit line when the reading voltage $V_{read}$ is applied to the word lines corresponding to the positive (resp. negative) activation values of the activation vector a.

The second term of the expression (4) corresponds to the bias value resulting from the difference between the number of positive activation values and the number of negative activation values in a.

Figure 4A:
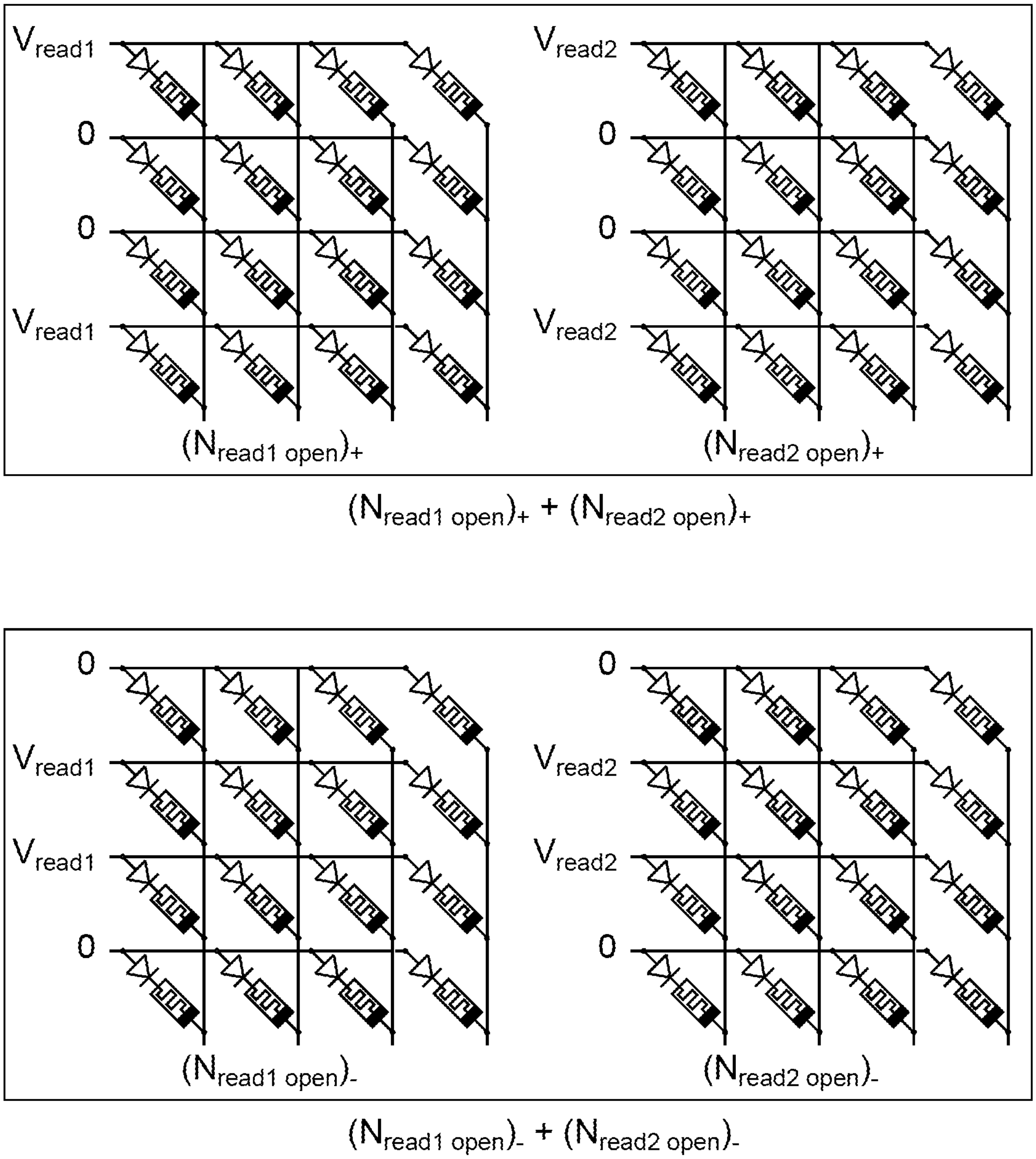
FIG. 4A schematically represents two successive reading phases of a multi-level 1S1R RRAM memory for the calculation of a MAC operation according to an embodiment of the present invention.

FIG. 4A schematically illustrates the two reading phases of a multi-level 1S1R memory allowing performing the calculation of a MAC operation. Like in the previous case, it has been assumed in this example that the activation vector was equal to $(+1, -1, -1, +1)^T$. The memory cells are herein with 3 levels.

In a first reading phase, a first reading voltage $V_{read1}$ is applied at the input of the memory, in a first step, to the word lines corresponding to the positive activation values. This operation is repeated in a second step, by applying a second reading voltage $V_{read2}$ to the same word lines.

For each bit line, the read current is equal to the sum of the currents in the different memory cells of the associated column. Thus, the current read in the first step is in the range of $(N_{read1\ open})_{+}\cdot I_{LRS}$ where $(N_{read1\ open})_{+}$ is the number of passing memory cells in the column. Similarly, the current read in the second step is in the range of $(N_{read2\ open})_{+}I_{LRS}$. The currents thus read in the first and second steps are summed up for each bit line, which is represented in the figure by the expression $((N_{read1\ open})_{+}+(N_{read2\ open})_{+})I_{LRS}$.

In a second reading phase, a first reading voltage $V_{read1}$ is applied at the input of the memory, in a first step, to the word lines corresponding to the negative activation values. This operation is repeated in a second step, by applying the second reading voltage $V_{read2}$ to the same word lines.

For each bit line, the current read in the first step is in the range of $(N_{read1\ open})_{-}\cdot I_{LRS}$ where $(N_{read1\ open})_{-}$ is the number of passing memory cells in the column. Similarly, the current read in the second step is in the range of $(N_{read2\ open})_{-}I_{LRS}$. The currents thus read in the first and second steps are summed up for each bit line, which is represented in the figure by the expression $((N_{read1\ open})_{-}+(N_{read2\ open})_{-})I_{LRS}$.

Considering now the behaviour of a memory cell during the two reading phases. The voltage-current characteristic of a memory cell has been represented in FIG. 4B. In the illustrated example, the number M of levels is equal to 3, in other words, the cell can be programmed in 3 different states. The 3 programming levels are discriminated by means of a reading at the first voltage $V_{read1}$ and a reading at the second voltage $V_{read2}$. When the reading at the voltages $V_{read1}$, $V_{read2}$ respectively gives $I_{HRS}$, $I_{LRS}$, the cell is programmed in a first state corresponding to the characteristic Iprog1(V). When the reading at the voltages $V_{read1}$,$V_{read2}$ respectively gives $I_{HRS}$, $I_{LRS}$, the cell is programmed in a second state corresponding to the characteristic Iprog2(V). Finally, when the reading at the voltages $V_{read1}$,$V_{read2}$ respectively gives $I_{LRS}$, $I_{LRS}$, the cell is programmed according to a third state corresponding to the characteristic Iprog3(V).

Hence, each memory cell can encode a synaptic coefficient able to take on three distinct values: −1, 0, +1.

Figures 4B, 4C:
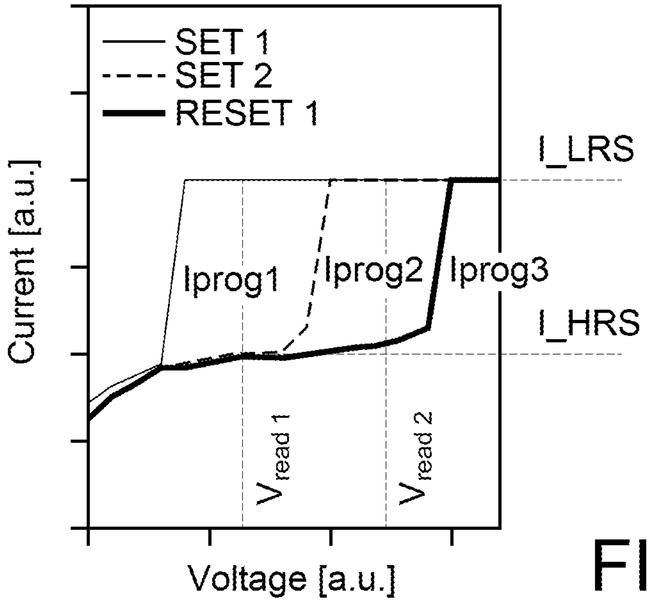

FIG. 4C schematically represents the truth table of a 3-level memory cell during the first reading phase. Since only the lines corresponding to positive activation values are read, only the circled portion at the bottom of the table is relevant. When the cell is not read, i.e. when its input is grounded, only a leakage current (originating from the neighbouring read cells), $I_{leak}$, with a negligible value, crosses the considered cell. However, when the cell is read, the output current depends on its state. In the first state, corresponding to a stored synaptic coefficient equal to −1, the output currents respectively read at $V_{read1}$,$V_{read2}$ are equal to $I_{HRS}$, $I_{HRS}$. The assigned numerical value, equal to the number of times the cell is conducting during reading, is equal to 0. In the second state, corresponding to a stored synaptic coefficient equal to 0, the output currents respectively read at $V_{read1}$, $V_{read2}$ are equal to $I_{HRS}$, $I_{LRS}$ and the assigned numerical value is equal to 1. Finally, in the third state, corresponding to a store synaptic coefficient equal to +1, the output currents respectively read at $V_{read1}$, $V_{read2}$ are equal to $I_{LRS}$, $I_{LRS}$ and the assigned numerical value is equal to 2.

FIG. 4D schematically represents the truth table of a 3-level memory cell during the second reading phase. Since only the lines corresponding to negative activation values are read, only the circled portion at the top of the table is relevant. When the cell is not read (input grounded), only a leakage current, beak, crosses it. However, when the cell is read, the output current depends on its state. In the first state, corresponding to a stored synaptic coefficient equal to −1, the output currents respectively read at $V_{read1}$, $V_{read2}$ are equal to $I_{HRS}$, $I_{HRS}$. The assigned numerical value, equal to the number of times the cell is conducting during reading, is equal to 0. In the second state, corresponding to a stored synaptic coefficient equal to 0, the output currents respectively read at $V_{read1}$, $V_{read2}$ are equal to $I_{HRS}$, $I_{LRS}$ and the assigned numerical value is equal to 1. Finally, in the third state, corresponding to a store synaptic coefficient equal to +1, the output currents respectively read at $V_{read1}$, $V_{read2}$ are equal to $I_{LRS}$, $I_{LRS}$ and the assigned numerical value is equal to 2.

When the number of positive activation values is equal to the number of negative activation values, the difference between the sum $(N_{read1\ open})_{+}+(N_{read2\ open})_{+}$ representative of the currents read in the first phase and the sum $(N_{read1\ open})_{-}+(N_{read2\ open})_{-}$ representative of the currents read in the second phase for the same bit line provides the scalar product w·a (each of the elements of the vector w stored in the cells of the column possibly taking on 3 levels). However, like before, when the number of positive activation values differs from the number of negative activation values, the obtained result is to be corrected for a bias related to the difference between the number of positive activation values and that of negative activation values, namely:

$$w \cdot a = ((N_{read1\ open})_+ + (N_{read2\ open})_+) - ((N_{read1\ open})_- + (N_{read2\ open})_-) - (\Sigma a_+ - a_-) \quad (5)$$

Figure 5A:
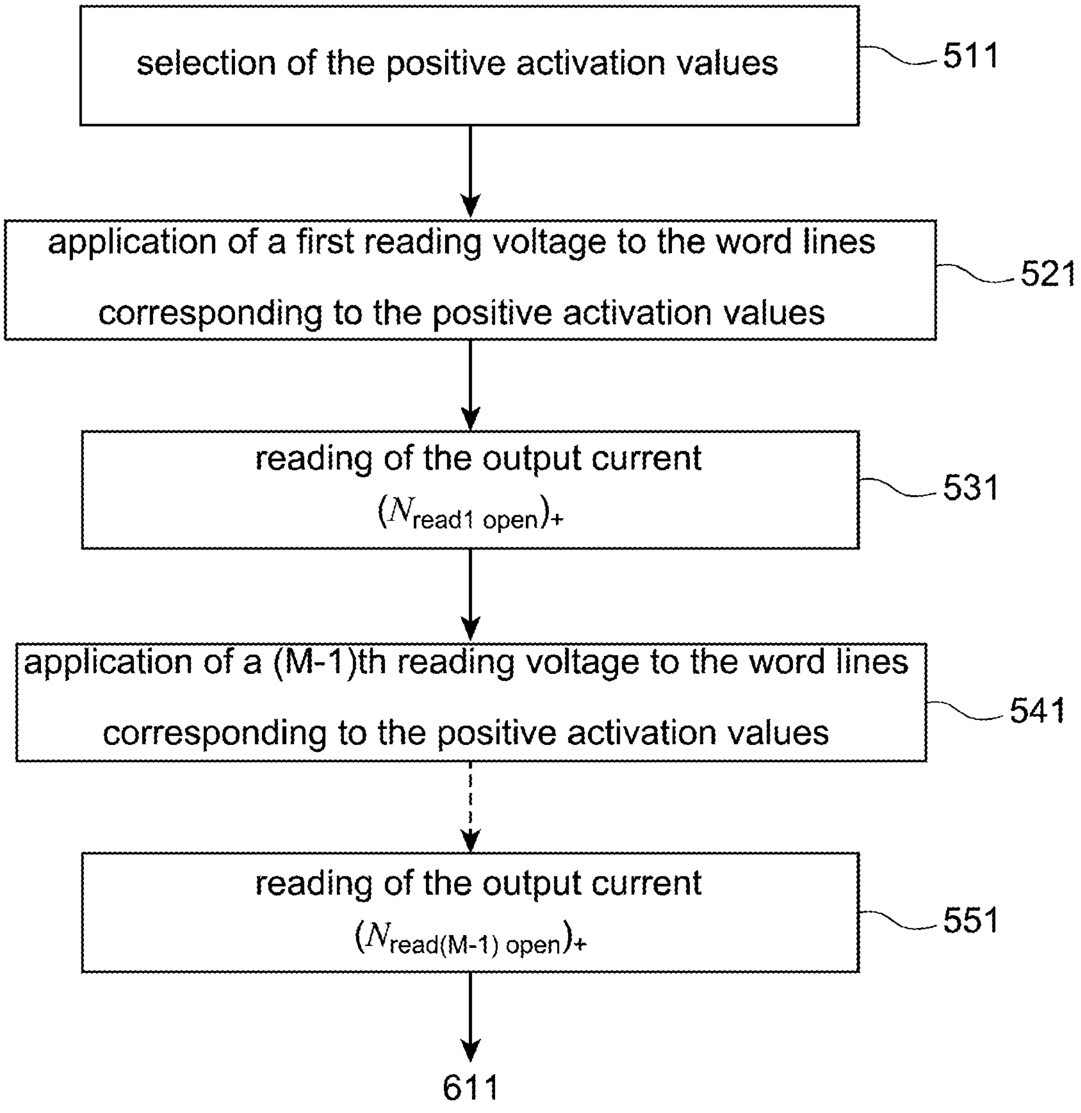
FIGS. 5A and 5B respectively represent a first reading phase and a second reading phase in an MLC RRAM memory, implemented in a method for calculating a MAC operation according to a general embodiment of the invention.
Figure 5B:
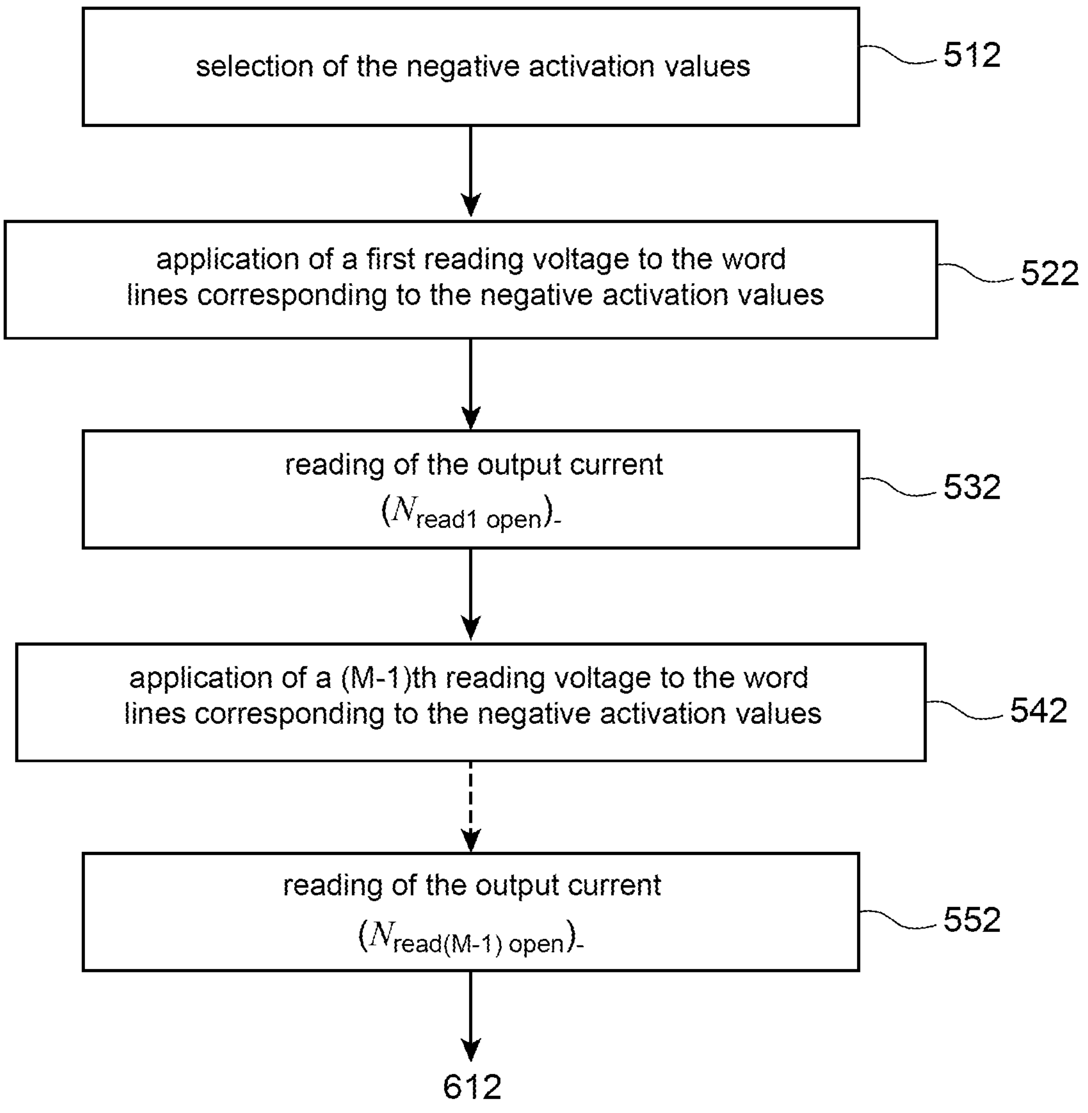

FIGS. 5A and 5B respectively represent a first reading phase and a second reading phase in an MLC RRAM memory, implemented in a method for calculating a MAC operation according to a general embodiment of the invention.

In this embodiment, the activation vector of the neural layer is composed of elements representing either a positive activation value $$\{a_i^+ = +1),$$

namely a negative activation value $$\{a_i^- = -1).$$

The synaptic coefficients may take on M distinct values. Each MC RRAM memory cell can store such a synaptic coefficient while being able to take on M distinct states, each state associated to a current-voltage characteristic of the cell ($Iprog_1(V)$ . . . , $Iprog_{M-1}(V)$). The readings of the output currents at the reading voltages, $V_{read_1}$, $V_{read_2}$, . . . , $V_{read_{M-1}}$ allow decoding the value of the synaptic coefficient stored in the cell. According to a preferred embodiment, the reading at the voltages $V_{read_1}$, $V_{read_2}$, . . . , $V_{read_{M-1}}$ allows obtaining a representation of this coefficient in the form of a thermometric code. Thus, the state m∈{0, . . . , M−1} could correspond in a biunivocal manner to the read output currents:

$$I_{read_1} = I_{LRS}, \quad . \quad . \quad . \quad , \quad I_{read_{m-1}} = I_{LRS}, I_{read_m} = I_{HRS}, \ . \ . \ . \ , I_{read_{M-1}} = I_{HRS}.$$

Alternatively, it should be understood that this correspondence could be reversed, the state m then being associate with the read output currents:

$$I_{read_1} = I_{HRS}, \ . \ . \ . \ , I_{read_{m-1}} = I_{HRS}, I_{read_m} = I_{LRS}, \ . \ . \ . \ , I_{read_{M-1}} = I_{LRS}.$$

Regardless of the used encoding convention, the first phase corresponds to the application of the successive reading voltages $V_{read1}$, $V_{read2}$, . . . , $V_{read_{M-1}}$ to the word lines corresponding to the positive activation values of the activation vector and the second phase corresponds to the application of these same successive voltages to the word lines corresponding to the negative activation values of the activation vector.

Thus, in FIG. 5A, only the word lines of the memory corresponding to the positive activation values are selected in 511. The voltage $V_{read_1}$ is applied in 521 to the lines thus selected and the output current is read in 531 on the bit line in which the synaptic coefficients are stored. The number $(N_{read1\ open})_+$ of passing memory cells on the bit line are determined from the current thus read. This determination is possible to the extent that $I_{LRS}$>N. $I_{HRS}$ where N is the size of the activation vector.

Afterwards, this operation is repeated by applying the voltage $V_{read2}$, . . . , $V_{read_{M-1}}$ to the selected word lines. The last reading operation is represented in 541 and the determination of the corresponding number of passing memory cells on the bit line, in 551.

FIG. 5B, only the word lines of the memory corresponding to the negative activation values are selected in 512. The voltage $V_{read1}$ is applied in 522 to the lines thus selected and the output current is read in 532 on the bit line in which the synaptic coefficients are stored. The number $(N_{read1\ open})_-$ of passing memory cells on the bit line are determined from the current thus read.

Afterwards, this operation is repeated by applying the voltage $V_{read2}$, . . . , $V_{read_{M-1}}$ to the selected word lines. The last reading operation is represented in 542 and the determination of the corresponding number of passing memory cells on the bit line, in 552.

It should be noted that the first and second reading phases could be interlinked. For example, it is possible to proceed by successively applying the voltages $V_{read1}$, $V_{read2}$, . . . , $V_{read_{M-1}}$ and by selecting in a first step the word lines corresponding to the positive activation value and in a second step those corresponding to the negative activation values.

Figure 6:
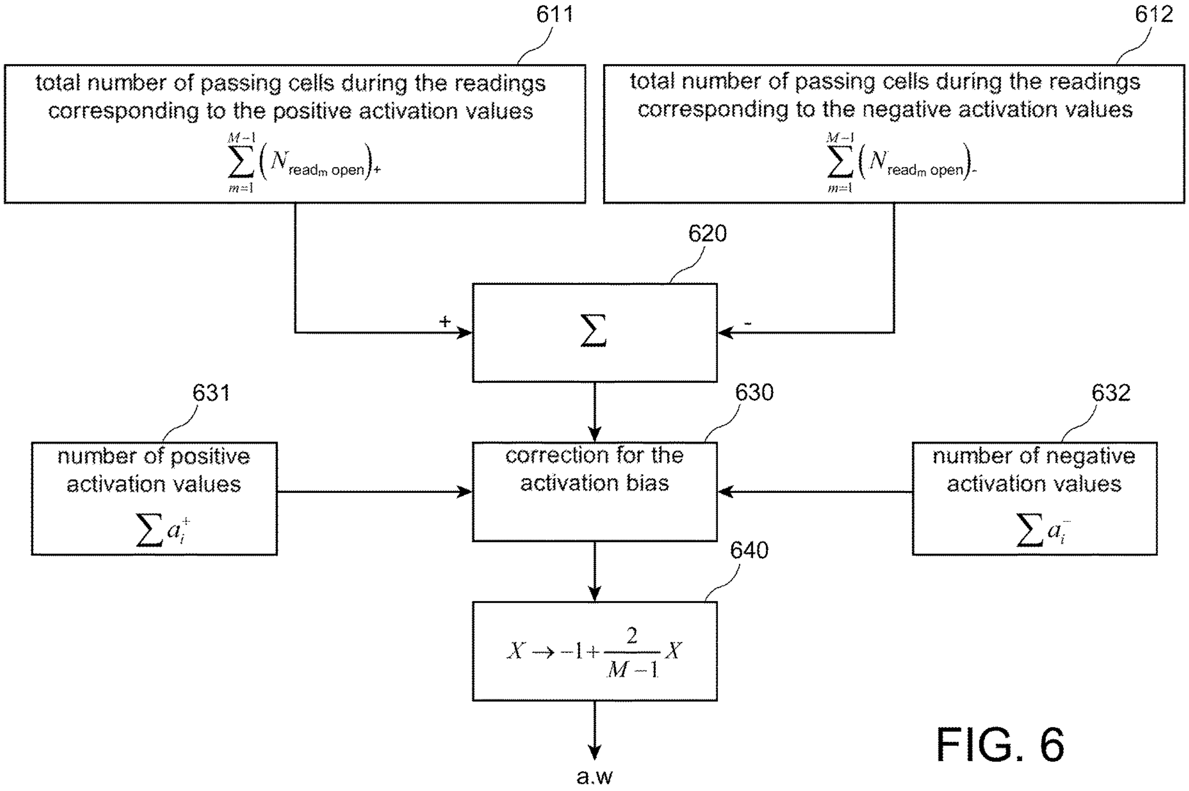
FIG. 6 represents a phase of combining the values read in the first and second reading phases, implemented in a method for calculating a MAC operation according to a general embodiment of the invention.

FIG. 6 represents a phase of combining the values read in the first and second reading phases for the calculation of the MAC operation.

The total number of passing memory cells during the first reading phase is obtained by summing up, in 611, the numbers of passing memory cells at each reading step of this phase, namely $$\sum_{m=1}^{M-1} (N_{read_m open})_+.$$

Similarly, the total number of passing memory cells during the second reading phase is obtained, in 612, namely $$\sum_{m=1}^{M-1} (N_{read_m open})_-.$$

Afterwards, the difference between the sum of the passing cells in the first phase and the sum of the passing cells in the second phase is calculated in 620.

This difference is corrected in 630 by subtracting from the result the bias equal to the difference between the number of positive activation values and the number of negative activation values in the activation vector.

Afterwards, the difference thus obtained may be normalised in 640 to switch from the variation range of the number of passing cells to the variation range of the possible quantised values of the synaptic coefficients. Thus, for example, if the possible quantised values of a synaptic coefficient are $$-1, -1 + \frac{2}{M-1}, \ldots, 1 - \frac{2}{M-1}, +1.$$

the normalisation operation will consist in transforming any integer X into a quantised value $$-1 + \frac{2}{M-1} X.$$

The obtained result is none other than that of the MAC operation, $$\sum_{i=1}^{N} w_i a_i$$

in other words the scalar product w·a. This calculation may be performed in parallel for all of the bit lines of the memory. Thus, the activation vector of the next layer of the neural network may be quickly calculated, including when the synaptic coefficients are quantised over more than 2 levels (M>2) by means of an MLC-type RRAM memory.

The invention claimed is:

1. A method for calculating a MAC operation to provide a scalar vector between a first vector, whose elements are binary elements, and a second vector whose elements are values quantised over M>2 levels, said operation being carried out by means of a memory composed of memory cells including a plurality of word lines and a plurality of bit lines, a memory cell relating each word line to each bit line according to a crossbar configuration, each memory cell configured to take on a plurality M states, each state being associated with a current-voltage characteristic of the cell, the memory cells of a bit line storing the elements of the second vector, wherein each memory cell is read by successively applying M−1 voltages $V_{read_1}, V_{read_2}, \ldots, V_{read_{M-1}}$ on its word line and by reading the corresponding output currents on its bit line, said output currents giving a representation in the form of a thermometric code of the stored element, said method comprising:

- a first reading phase in which the word lines corresponding to the elements of the first vector having a first binary value are selected, the voltages $V_{read_1}, V_{read_2}, \ldots, V_{read_{M-1}}$ are successively applied to the word lines thus selected, the corresponding output currents are read on the bit line and the number of passing cells on this bit line is deduced at each reading;
- a second reading phase in which the word lines corresponding to the elements of the first vector having a second binary value are selected, the voltages $V_{read_1}, V_{read_2}, \ldots, V_{read_{M-1}}$ are successively applied to the word lines thus selected, the corresponding output currents are read on the bit line and the number of passing cells on this bit line is deduced at each reading;
- the difference between the total number of passing cells in the first phase and the total number of passing cells in the second phase is calculated;
- the difference thus obtained is corrected for a bias equal to the difference between the number of elements of the first vector having the first binary value and the number of elements of the second vector having the second binary value, to thereby deduce a scalar product between the first vector and the second vector.

2. The method for calculating a MAC operation according to claim 1, wherein the memory cells are made by means of an ovonic selector in series with a resistive element programmable in a low-resistivity state or a high-resistivity element.

3. The method for calculating a MAC operation according to claim 1, wherein the first vector is an activation vector whose elements are the activation values of a neural layer, the activation values configured to take on the values +1 and −1.

4. The method for calculating a MAC operation according to claim 3, wherein the second vector is a synaptic coefficient vector of synapses between said neural layer and a next layer of a neural network quantised over M levels.

5. The method for calculating a MAC operation according to claim 4, wherein the quantised values of the synaptic coefficients are equal to $$-1, -1+\frac{2}{M-1}, \ldots, 1-\frac{2}{M-1}, +1.$$

6. The method for calculating a MAC operation according to claim 5, wherein the scalar product is deduced from the difference between the total number of passing cells in the first phase and the total number of passing cells in the second phase, corrected for the bias, by means of a normalisation operation transforming an integer X into a synaptic coefficient quantised value, $$-1+\frac{2}{M-1}X.$$

7. The method for calculating a MAC operation according to claim 1, wherein said memory is a 1S1R type RRAM or a three terminal memory.

8. The method for calculating a MAC operation according to claim 1, wherein said memory is a three-terminal memory which is a FeFET memory or a flash memory.

9. The method for calculating a MAC operation according to claim 2, wherein the selector is a Mixed Ionic Electronic conduction selector, a Metal Insulator Transition selector, a diode type selector or a filamentary volatile selector.

* * * * *